United States Patent
Lee et al.

(10) Patent No.: US 6,965,964 B2
(45) Date of Patent: Nov. 15, 2005

(54) NAND FLASH MEMORY DEVICE

(75) Inventors: Yeong-Taek Lee, Seoul (KR); Kang-Deog Suh, Kyunggi-do (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 255 days.

(21) Appl. No.: 10/340,359

(22) Filed: Jan. 9, 2003

(65) Prior Publication Data

US 2003/0135690 A1 Jul. 17, 2003

(30) Foreign Application Priority Data

Jan. 15, 2002 (KR) .................................. 2002-2309

(51) Int. Cl.$^7$ .............................................. G06F 12/00
(52) U.S. Cl. .................................. 711/103; 365/185.33
(58) Field of Search .................... 711/103; 365/185.33

(56) References Cited

U.S. PATENT DOCUMENTS

| | | | | |
|---|---|---|---|---|
| 5,307,464 A | * | 4/1994 | Akao et al. | ................ 715/810 |
| 5,640,349 A | * | 6/1997 | Kakinuma et al. | ..... 365/185.33 |
| 5,936,887 A | | 8/1999 | Choi et al. | |
| 6,111,775 A | * | 8/2000 | Schaefer | ...................... 365/63 |

* cited by examiner

*Primary Examiner*—Matthew D. Anderson
(74) *Attorney, Agent, or Firm*—Marger Johnson & McCollom, P.C.

(57) ABSTRACT

A NAND flash memory device is provided. The memory device includes M input/output pins for inputting and outputting M-bit data (M is any natural number), first and second input buffer circuits, an address register, a command register, and a data input register. The first and second input buffer circuits receive N least significant bits (N is any natural number) and N most significant bits, respectively, of the M-bit data inputted via the input/output pins. The address register receives as an address an output of the first input buffer circuit in response to address load signals. The command register receives as a command an output of the first address buffer circuit in response to the command load signal. The data input register simultaneously receives outputs of the first and second input buffer circuits in response to the data load signal, as data to be programmed. The M-bit data latched in the data input register is loaded on the sense and latch block via a data bus. According to these configurations of the NAND flash memory device, at each of modes of operation where a command, an address, and data are serially received, the data is inputted and outputted through all of the M input/output pins, while each of the command and the address is inputted through N least significant bit input/output pins.

13 Claims, 8 Drawing Sheets

NAND FLASH MEMORY DEVICE

RELATED APPLICATION

This application claims priority from Korean Patent Application No. 2002-02309, filed on Jan. 15, 2002, the contents of which are herein incorporated by reference in their entirety.

FIELD OF THE INVENTION

This disclosure relates to a NAND flash memory device and, more specifically, to a NAND flash memory device with an interface structure that is different from an address and command interface structure.

BACKGROUND OF THE INVENTION

NAND flash memory devices have a command/address/data multiplexing input/output port structure in a known manner. The NAND flash memory device with the multiplexing input/output port structure adopts command and address preset manners. The command preset manner is to preset an operation to be performed after inputting predetermined data combination (for example, "00h", "60h", "70h", "80h", "FFh", and the like) in a memory device via input/output pins. The address preset manner is to preset an address needed for writing/reading out data into/from a memory device. Unlike a semiconductor memory device such as a static random access memory (SRAM) device, the NAND flash memory device performs a read/write operation after presetting a command and an address. In the case of the NAND flash memory device, it is possible to share address input pins and data input/output pins. This is because an input interval of data is completely separated from an input interval of an address or a command.

A 64 M×8 bit NAND flash memory device, for example, includes 8 input/output pins I/00–I/07 and 5 control pins CLE, ALE, /WE, /RE, and /CE. As explained above, the 8 input/output pins are used when an address and a command are inputted and when data is inputted and outputted. A signal applied to the control pin CLE is a command latch enable signal informing that data inputted via input/output pins is a command, and a signal applied to the control pin ALE is an address latch enable signal informing that data inputted via input/output pins is an address. A signal applied to the control pin /WE is a write enable signal that is an input clock or synchronous signal of an address, a command, and data, and a signal applied to the control pin /RE is a read enable signal that is an output clock or synchronous signal of data. A signal applied to the control pin /CE is a chip enable signal. In the case of a 512 M-bit NAND flash memory device, a 26-bit address is required and four-cycle toggling of the write enable signal /WE is needed to receive the 26-bit address via 8 input/output pins. Because the number of the input/output pins of the foregoing memory device is 8, the number of data lines for internally transferring data is also 8. That is, a typical NAND flash memory device has the same data interface structure as an address/command interface structure.

SUMMARY OF THE INVENTION

It is therefore a feature of embodiments of the present invention to provide a NAND flash memory device with a data interface structure different from an address/command interface structure.

DESCRIPTION OF THE PREFERRED EMBODIMENT

Details of the present invention will now be more fully described hereinafter with reference to the accompanying drawings, in which preferred embodiments of the invention are shown.

Figure 1:
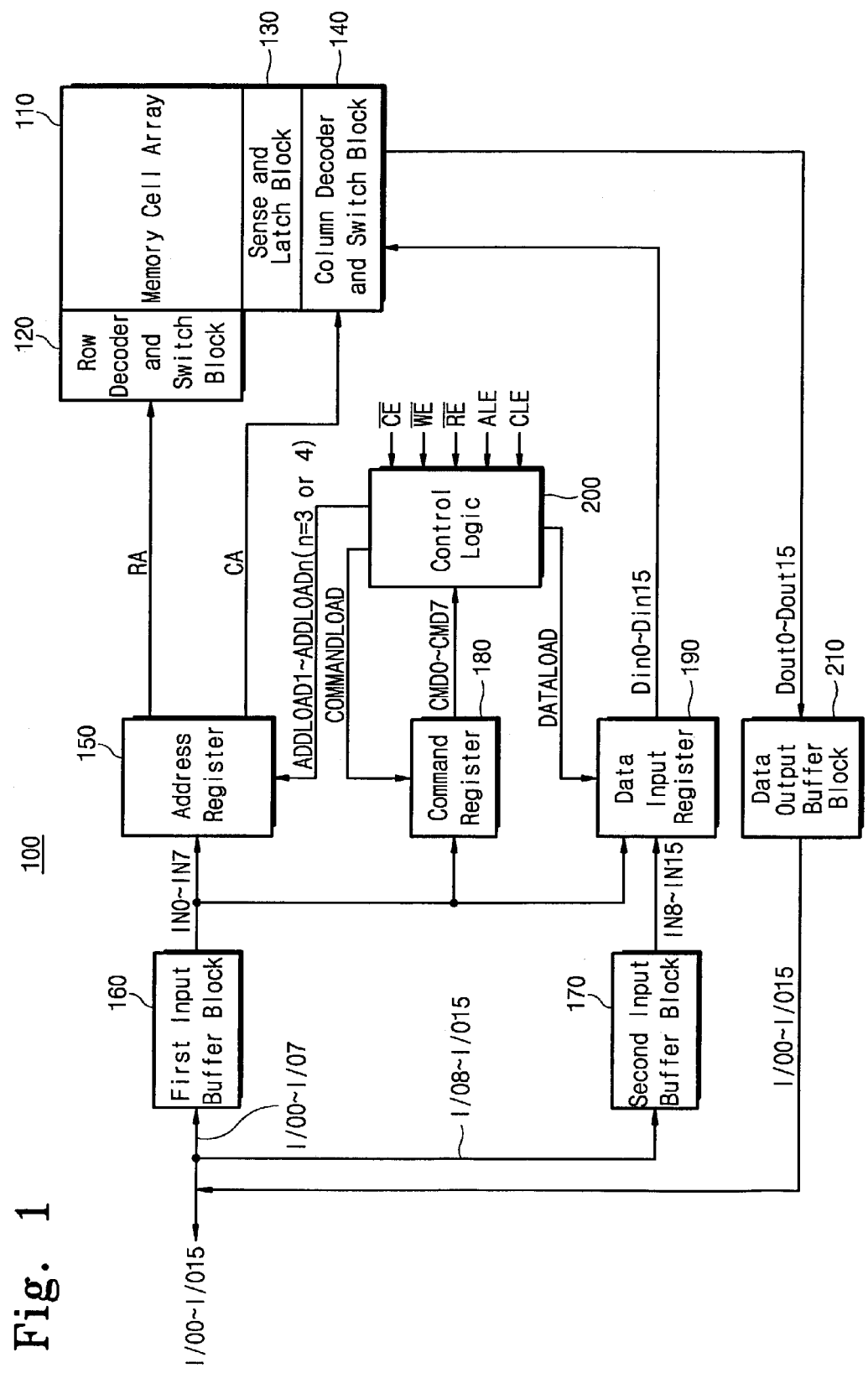
FIG. 1 is a block diagram illustrating a NAND flash memory device according to an embodiment of the present invention.

FIG. 1 is a block diagram illustrating a NAND flash memory device according to an embodiment of the present invention. The NAND flash memory device 100 of FIG. 1 includes a memory cell array 110 for storing data information. As is known to those skilled in the art, the memory cell array 110 includes a plurality of cell strings corresponding respectively to columns or bit lines. Each cell string is formed of a string select transistor, a ground select transistor, and a plurality of memory cells (or memory cell transistors) serially connected between the select transistors. An example of the cell strings is disclosed in U.S. Pat. No. 5,936,887 entitled "NON-VOLATILE MEMORY DEVICE WITH NAND TYPE CELL STRUCTURE", the contents of which are incorporated herein in their entirety for all purposes.

Referring to FIG. 1, the NAND flash memory device 100 further includes a row decoder and switch block 120, a sense and latch block 130, and a column decoder and switch block 140. The row decoder and switch block 120 receives row address (or select) information RA from an address register block 150, and selects a word line at each of modes of operation. The row decoder and switch block 120 transfers a voltage for each mode of operation to the selected word line, and voltages for each of modes of operation to the non-selected word lines, respectively. The sense and latch block 130 is normally called "a page buffer", and senses and latches data stored in memory cells of the selected word line during a read operation. The sense and latch block 130 latches program data transferred via the column decoder and switch block 140 at a program operation, and programs the latched data into memory cells of the selected word line. The column decoder and switch block 140 is operated responsive to row address (or select) information CA received from the address register block 150. The column decoder and switch block 140 transfers data stored in the sense and latch block 130 to a data bus Dout_i at a read operation, and program data on a data bus Din_i to the sense and latch block 130 at a write operation.

In some embodiments of the present embodiment, each of the data buses Din_i and Dout_i includes 16 data lines. That is, data to be read out from/written into the memory cell array 110 are transferred by a word (×16) unit. On the other hand, in the case of the NAND flash memory device, an address and a command are transferred by a byte (×8) unit.

As illustrated in FIG. 1, the NAND flash memory device 100 includes 16 input/output pins I/O0~I/O15 and 5 control pins /CE, /WE, /RE, ALE, and CLE, The 16 input/output pins I/O0~I/O15 are used when an address and a command are inputted and when data is inputted and outputted. A signal applied to the control pin CLE is a command latch enable signal informing that data inputted via the input/output pins is a command, and a signal applied to the control pin ALE is an address latch enable signal informing that data inputted via the input/output pins is an address. A signal applied to the control pin /WE is a write enable signal that is an input synchronous signal of an address, a command, and data, and a signal applied to the control pin /RE is a read enable signal that is an output synchronous signal of data. A signal applied to the control pin /CE is a chip enable signal. In some embodiments, when the signal /CE is low and the signal CLE is high, a command is input in synchronization with a transition of the signal /WE. When the signal /CE is low and the signal ALE is high, a command is inputted in synchronization with a transition of the signal /WE. When the signals CLE and ALE are low, data is inputted in synchronization with a transition of the signal /WE.

The NAND flash memory device 100 of FIG. 1 further includes first and second input buffer blocks 160 and 170, a command register block 180, a data input register block 190, a control logic 200, and a data output buffer block 210. The first input buffer block 160 is connected to receive 8 least significant bits (or less significant byte data) of 16-bit data inputted via 16 input/output pins I/O0~I/O15. The second input buffer block 170 is connected to receive 8 most significant bits (or more significant byte data) of the 16-bit data inputted via the 16 input/output pins (I/O0~I/O15). That is, the first input buffer block 160 is connected to 8 input/output pins I/O0~I/O7, and the second input buffer block 170 is connected to 8 input/output pins I/O8~I/O15.

The control logic 200 is operated responsive to external control signals /CE, /WE, /RE, ALE, and CLE, and generates a number of address load signals ADDLOAD_j (j=1~3 or 1~4), a command load signal COMMANDLOAD, and a data load signal DATALOAD. For example, when the signal nCE is low and the signal CLE is high, the control logic 200 generates the command load signal COMMANDLOAD in synchronization with a high-to-low transition of the signal /WE. When the signal nCE is low and the signal ALE is high, the control logic 200 generates the command load signal COMMANDLOAD in synchronization with a high-to-low transition of the signal /WE. When the signals CLE and ALE are low, the control logic 200 generates a data load signal DATALOAD in synchronization with a high-to-low transition of the signal /WE.

The address register block 150 receives as an 8-bit address an output of the first input buffer block 160 via the first internal bus IN0~IN7 in response to the address load signals ADDLOAD_j. As the address load signals ADDLOAD1~ADDLOAD4 are serially produced, at most 32-bit address may be loaded in the address register block 150. An address inputted in the address register block 150 is row and column select information RA and CA, which are transferred to the row decoder and switch block 120 and to the column decoder and switch block 140, respectively. The command register block 180 is operated responsive to the command load signal COMMANDLOAD, and transfers as an 8-bit command CMD0~CMD7 an output of the first input buffer block 160 to the control logic 200 via the first internal bus IN0~IN7. The control logic 200 controls program/read/erase operations of the memory device in response to the transferred command CMD0~CMD7. The data input register block 190 simultaneously receives an output of the first input buffer block 160 via the first internal bus IN0~IN7 and an output of the second input buffer block 170 via the second internal bus IN8~IN15, as 16-bit data. The received 16-bit data is loaded on the data bus Din0~Din15 and latched in the sense and latch block 130 via the column decoder and switch block 140. At a read operation, the data output buffer block 210 transfers the 16-bit data loaded on the data bus Dout0~Dout15 to the input/output pins I/O0~I/O15.

As can be determined from the foregoing descriptions, the NAND flash memory device of FIG. 1 has an address/command interface structure different from a data interface structure. In other words, data is transferred by a word (×16) unit while an address and a command are transferred by a byte (×8) unit.

Figure 2A:
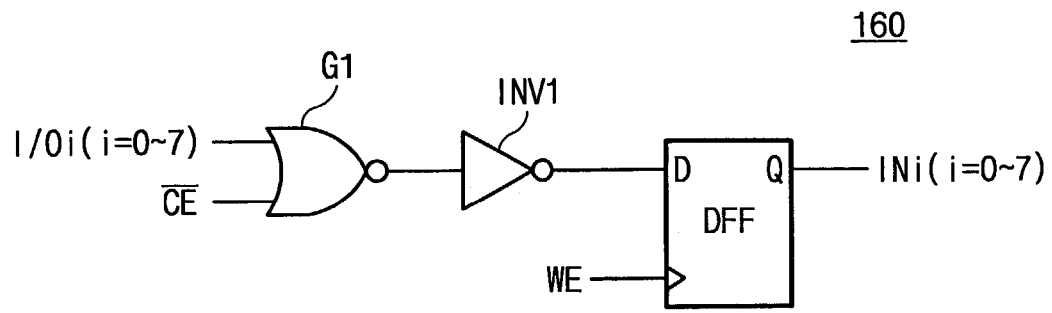
FIG. 2A is a circuit diagram illustrating a first input buffer circuit that can be used with the memory device of FIG. 1.

FIG. 2A is a circuit diagram illustrating an example of a first input buffer block that can be used with the device of FIG. 1. Referring to FIG. 2A, the first input buffer block 160 includes 8 input buffers, but, only one input buffer is illustrated in FIG. 2A. The input buffer 160 includes a NOR gate G1, an inverter INV1, and a D flip-flop DFF. The NOR gate G1 has a first input terminal connected to a corresponding input/output pin I/Oi (i=0~7) and a second input terminal connected to receive the signal /CE. An output of the NOR gate G1 is transferred to an input terminal D of the D flip-flop DFF via the inverter INV1. A signal WE is provided to a clock terminal of the D flip-flop DFF. When the signal /CE is at a low level, the D flip-flop DFF latches data applied to the corresponding input/output pin I/Oi in synchronization with a low-to-high transition of the signal WE. The signal WE is complementary to the signal /WE.

Figure 2B:
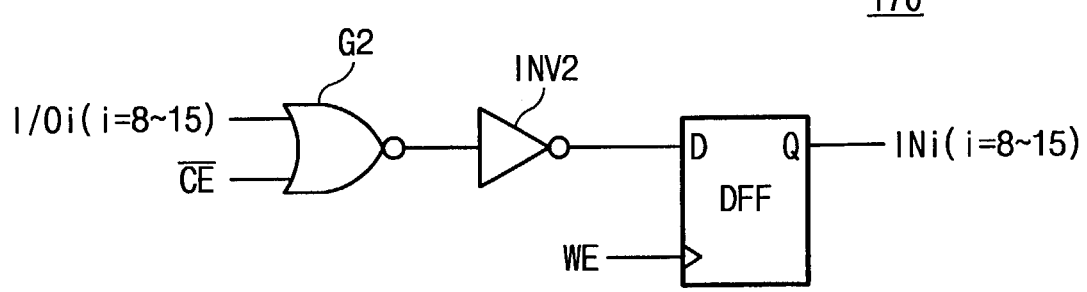
FIG. 2B is a circuit diagram illustrating a second input buffer circuit that can be used with the memory device of FIG. 1.

FIG. 2B is a circuit diagram illustrating a second input buffer block that can be used with the memory circuit of FIG. 1. Referring to FIG. 2B, the second input buffer block 170 includes 8 input buffers, but, only one input buffer is illustrated in FIG. 2B. The input buffer 170 includes a NOR gate G2, an inverter INV2, and a D flip-flop DFF. The NOR gate G2 has a first input terminal connected to a corresponding input/output pin I/Oi (i=8~15) and a second input terminal connected to receive the signal /CE. An output of the NOR gate G2 is transferred to an input terminal D of the D flip-flop via the inverter INV2. A signal WE is provided to a clock terminal of the D flip-flop DFF. When the signal /CE is at a low level, the D flip-flop DFF latches data applied to the corresponding input/output pin I/Oi in synchronization with a low-to-high transition of the signal WE.

Figure 3:
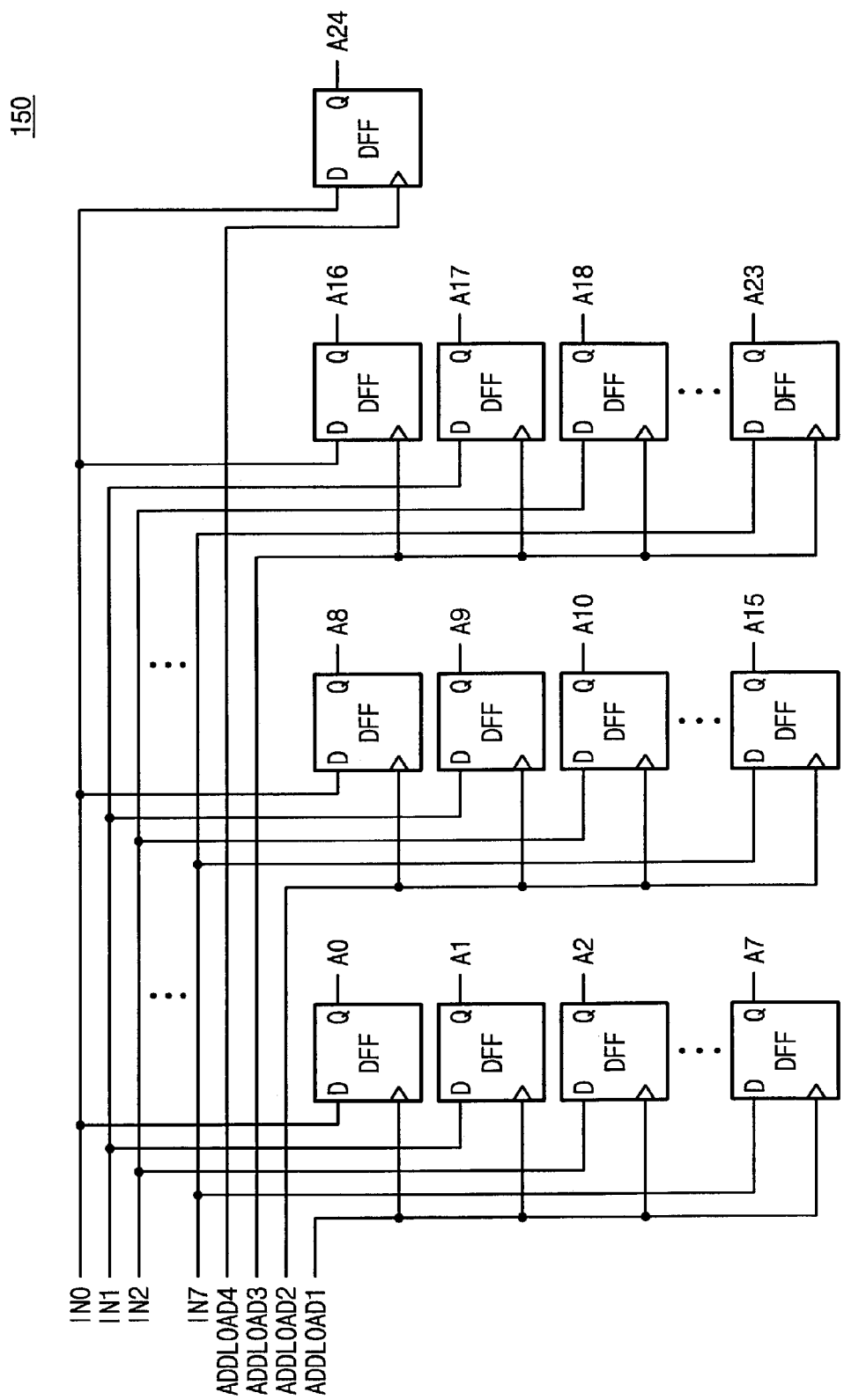
FIG. 3 is a circuit diagram illustrating an address register that can be used with the memory device of FIG. 1.

FIG. 3 is a circuit diagram illustrating an address register block 150 that can be used with the memory device of FIG. 1. In the illustrated embodiment of FIG. 1, the NAND flash memory device is a 32 M×16 bit NAND flash memory device that uses a 25-bit address. The address register block 150 includes 25 D flip-flops DFF so as to latch 25 address bits. The D flip-flops DFF are divided into first to fourth groups. The D flip-flops DFF of the first group are operated in synchronization with a first address load signal ADDLOAD1, and respectively latch signals transferred via the corresponding internal bus lines IN0~IN7. The D flip-flops DFF of the second group are operated in synchronization with a second address load signal ADDLOAD2, and respectively latch signals transferred via the corresponding internal bus lines IN0~IN7. The D flip-flops DFF of the third group are operated in synchronization with a third address load signal ADDLOAD3, and respectively latch signals transferred via the corresponding internal bus lines IN0~IN7. The D flip-flop DFF of the fourth group is operated in synchronization with a fourth address load signal ADDLOAD4, and latches a signal transferred via the internal bus line IN0. When the first address load signal ADDLOAD1 is activated, the signals on the internal bus lines IN0~IN7 are respectively latched in the D flip-flops DFF of the first group. When the second address load signal ADDLOAD2 is activated, the signals on the internal bus lines IN0~IN7 are respectively latched in the D flip-flops DFF of the second group. When the third address load signal ADDLOAD3 is activated, the signals on the internal bus lines IN0~IN7 are respectively latched in the D flip-flops DFF of the third group. When the fourth address load signal ADDLOAD4 is activated, the signal on the internal bus line IN0 is latched in the D flip-flop DFF of the fourth group. As described above, because the address load signals ADDLOAD1~ADDLOAD4 are activated in synchronization with a low-to-high transition of the signal /WE, four-cycle toggling of the signal /WE is used to latch all the 25-bit address.

Figure 4:
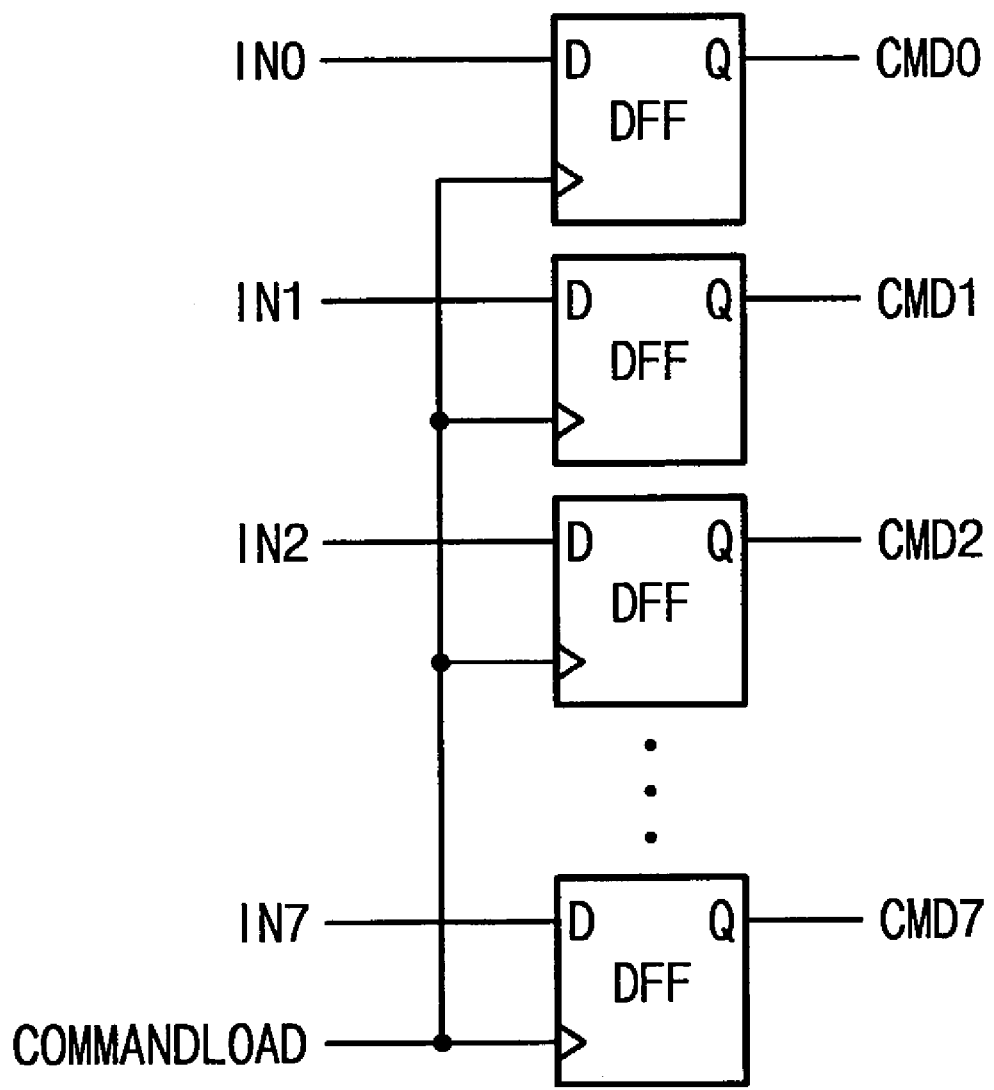
FIG. 4 is a circuit diagram illustrating a command register that can be used with the memory device of FIG. 1.

FIG. 4 is a circuit diagram illustrating a command register block that can be used with the memory device of FIG. 1. As illustrated in FIG. 4, the command register block 180 includes 8 D flip-flops DFF. The D flip-flops DFF respectively latch signals on the corresponding bus lines IN0~IN7 in response to a low-to-high transition of the command load signal COMMANDLOAD. As an 8-bit command, the latched signals CMD0~CMD7 are transferred to the control logic.

Figure 5:
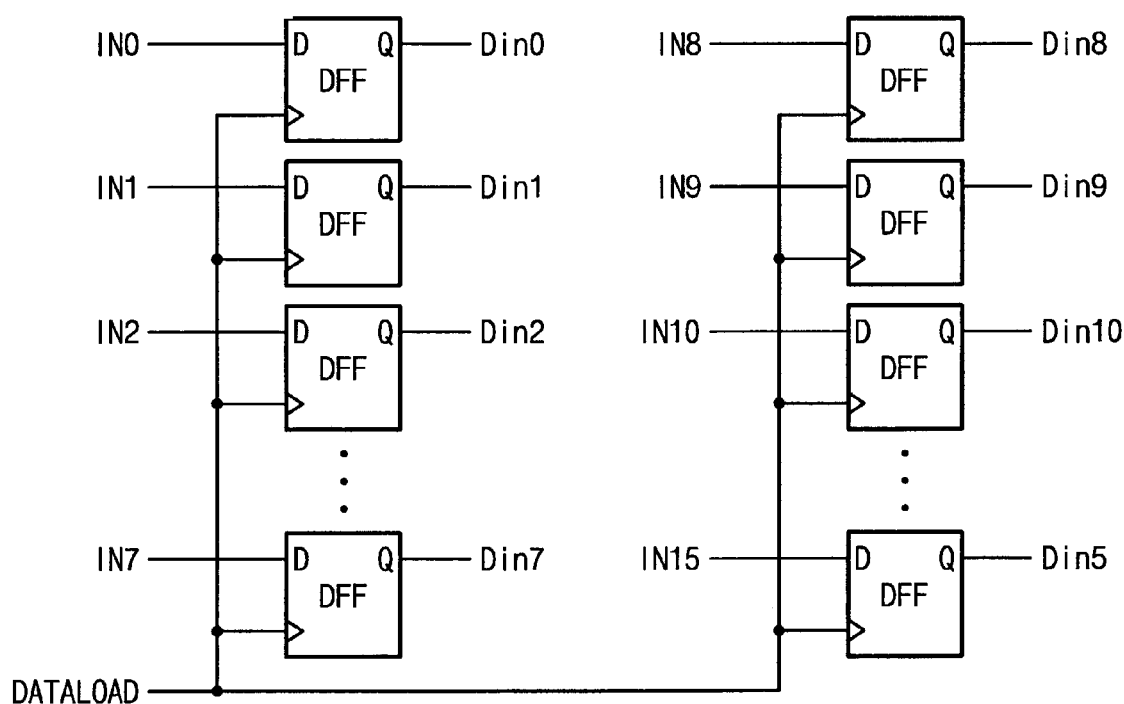
FIG. 5 is a circuit diagram illustrating a data input register that can be used with the memory device of FIG. 1.

FIG. 5 is a circuit diagram illustrating a data input register block that can be used with the memory device of FIG. 1. Referring to FIG. 5, the data input register block 190 includes 16 D flip-flops DFF. Eight D flip-flops are respectively connected to bus lines IN0~IN7 constituting a first internal bus, and eight D flip-flops are respectively connected to bus lines IN8~IN15 constituting a second internal bus. The D flip-flops DFF respectively latch signals on the corresponding bus lines IN0~IN15 in response to a low-to-high transition of the data load signal DATALOAD. The latched signals are 16-bit data that is loaded on the data bus Din0~Din15 to be transferred to the sense and latch block 130 via the colunm gate and switch block 140.

Figure 6:
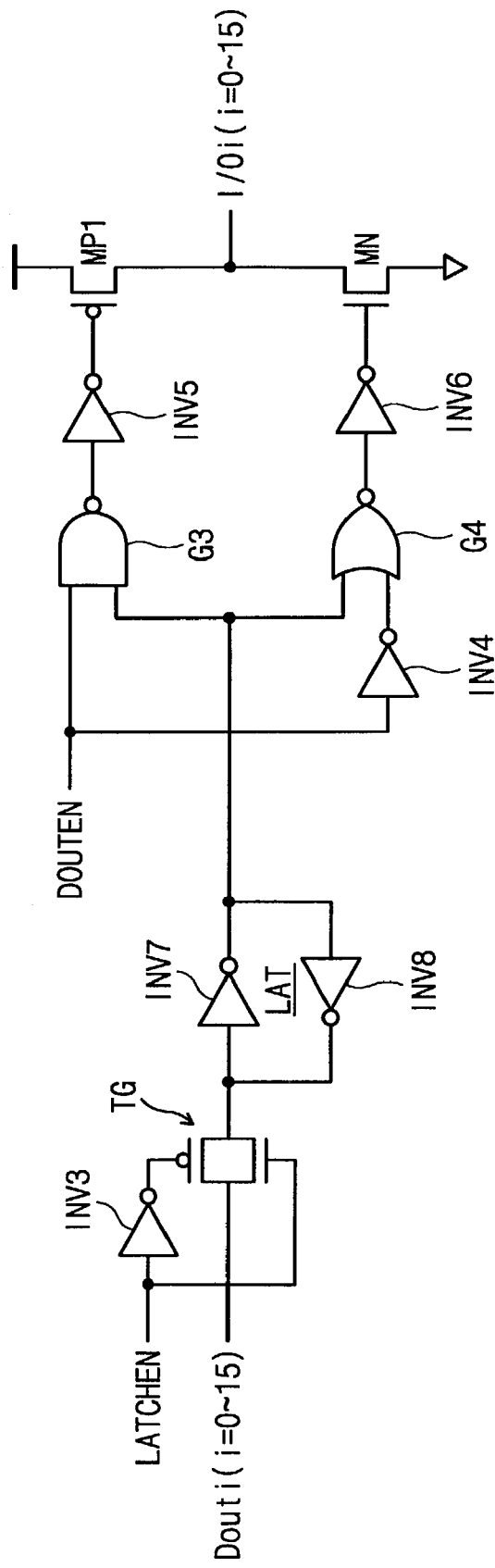
FIG. 6 is a circuit diagram illustrating a data output buffer circuit that can be used with the memory device of FIG. 1.

FIG. 6 is a circuit diagram illustrating a data output buffer block that can be used with the memory device of FIG. 1. Referring to FIG. 6, the data output buffer block 210 includes 16 data output buffers corresponding respectively to the data bus lines Dout0~Dout15, but, only one data output buffer is illustrated in FIG. 6. The data output buffer 210 includes 4 inverters INV3~INV6, a transmission gate TG, a latch LAT formed of inverters INV7 and INV8, a NAND gate G3, a NOR gate G4, a PMOS transistor MP1, and an NMOS transistor MN1. When a control signal LATCHEN is at a high level, a signal on the data bus line Douti is latched in the latch LAT via the transmission gate TG. When a control signal DOUTEN is at a high level, a pull-up driver (or a PMOS transistor) or a pull-down driver (or a NMOS transistor) drives a corresponding input/output pin I/0i according to a value latched in the latch LAT.

Figure 7:
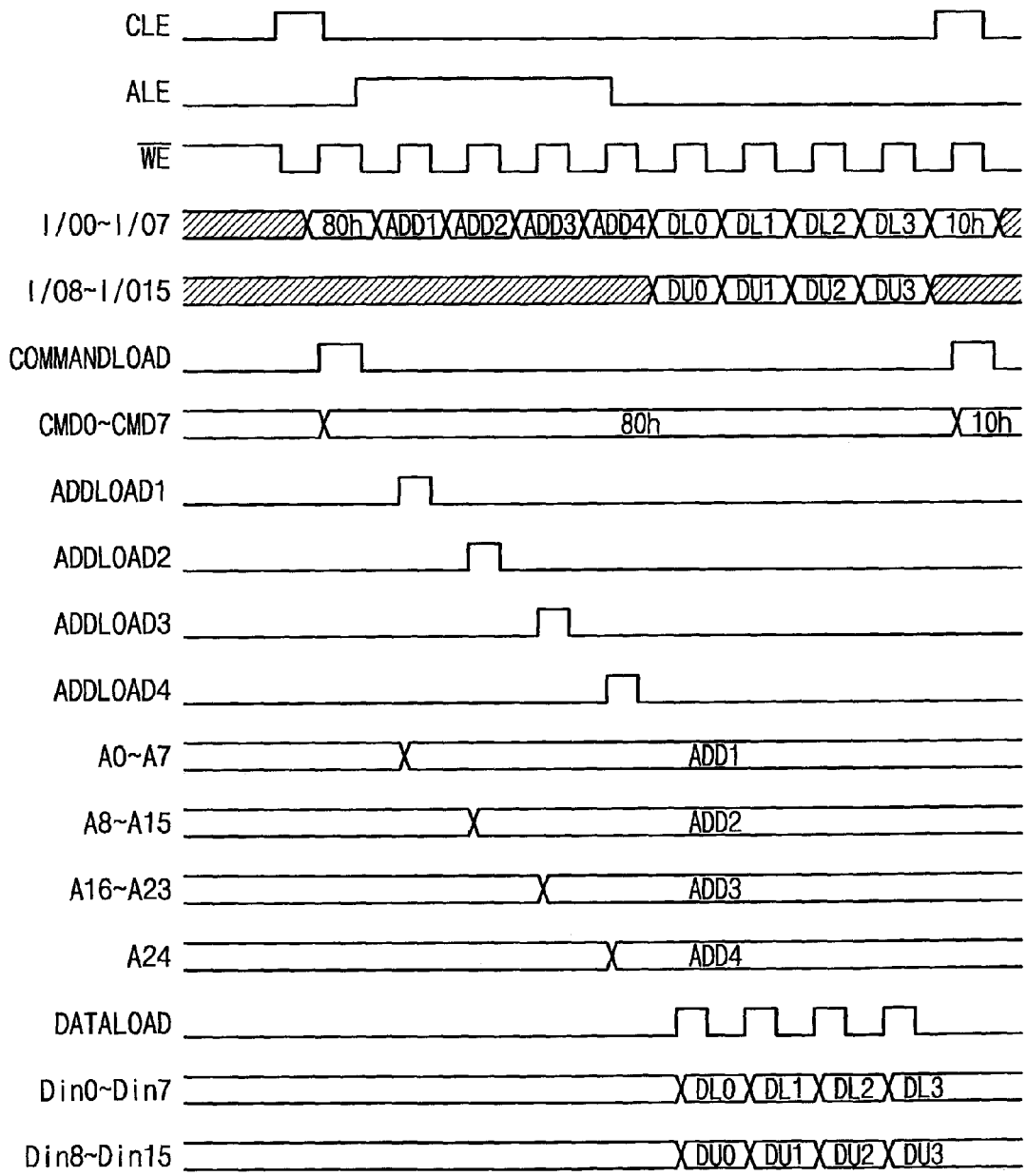
FIG. 7 is a timing diagram illustrating a program operation of a NAND flash memory device according to embodiments of the present invention.

FIG. 7 is a timing diagram illustrating a program operation of the NAND flash memory device of FIG. 1. As described above, the NAND flash memory device of FIG. 1 has a data interface structure different from an address/command interface structure. For example, an address and a command are transferred by a ×8 unit, and data is transferred by a ×16 unit. Also, the NAND flash memory device of FIG. 1 adopts command and address preset manners. That is, the command preset manner is to preset an operation to be performed after inputting a pre-defined data combination (for example, "00h", "60h", "70h", "80h", "FFh", and the like) in a-memory device via input/output pins. The address preset manner is to preset an address used for writing/reading out data into/from the memory device. Hereinafter, the program operation of the NAND flash memory device according to embodiments of the present invention will be described in detail.

To begin with, 8-bit command data is provided from outside the memory device (for example, a memory controller) to the memory device. Because the 8-bit command data is provided to 16 input/output pins I/00~I/015, valid 8-bit command data is provided to only 8 least significant bit input/output pins I/00~I/015. Data loaded on 8 most significant bit input/output pins I/08~I/015 is invalid. The first input buffer block 160 latches the 8-bit command data (80h: a program command) loaded on the least significant bit input/output pins I/00~I/07 according to a low-to-high transition of the signal WE. An output of the first input buffer block 160 is transferred as the 8-bit command CMD0~CMD7 to the command register block 180 via the first internal bus IN0~IN7, when the command load signal COMMANDLOAD outputted from the control logic 200 transitions from a low level to a high level.

Next, when the signal CLE is low and the signal ALE is high, the 25-bit address is latched in the address register block 180 in synchronization with a high-to-low transition of the signal /WE. That is, when the address load signal ADDLOAD1 is activated, the 8-bit data loaded on the input/output pins I/00~I/07 is latched in the D flip-flops of the first group of the address register block 150 (FIG. 3). When the address load signal ADDLOAD2 is activated, the 8-bit data loaded on the input/output pins I/00~I/07 is latched in the D flip-flops of the second group of the address register block 150. When the address load signal ADDLOAD3 is activated, the 8-bit data loaded on the input/output pins I/00~I/07 is latched in the D flip-flops of the third group of the address register block 150. When the address load signal ADDLOAD4 is activated, the 1-bit data loaded on the input/output pin I/00 is latched in the D flip-flop of the fourth group of the address register block 150. Consequently, address and command data are respectively latched in the corresponding registers 150 and 180 by a ×8 unit.

As illustrated in FIG. 7, when the signals CLE and ALE are at a low level, program data will be latched in the sense and latch block 130 (FIG. 1) in synchronization with the signal /WE. In other words, if the 16-bit data is loaded on the input/output pins I/00~I/15, data bits (i.e., less significant byte data DL0) on the input/output pins I/00~I/07 are transferred onto the first internal bus IN0~IN7 via the first input buffer block 160. At the same time, data bits (i.e., more significant byte data DU0) on the input/output pins I/08~I/015 are transferred onto the second internal bus IN08~IN15 via the second input buffer block 170. As the data load signal DATALOAD is activated in synchronization with the signal /WE, the data input register block 190 (FIG. 5) latches the 16-bit data DL0 and DU0 on the first and second internal buses IN0~IN15. The latched 16-bit data is loaded on the data bus Din0~Din1 to be transferred to the sense and latch block 130 via the column decoder and switch block 140. The data load operation will be performed repeatedly until all data to be programmed will be loaded.

Finally, as a command data 10h informing an actual program is transferred to the control logic 200 in the same manner as described above, data loaded on the sense and latch block 130 will be programmed into the memory cell array 110. The program operation is performed as is known to those skilled in the art, and therefore will be omitted here for brevity.

Figure 8:
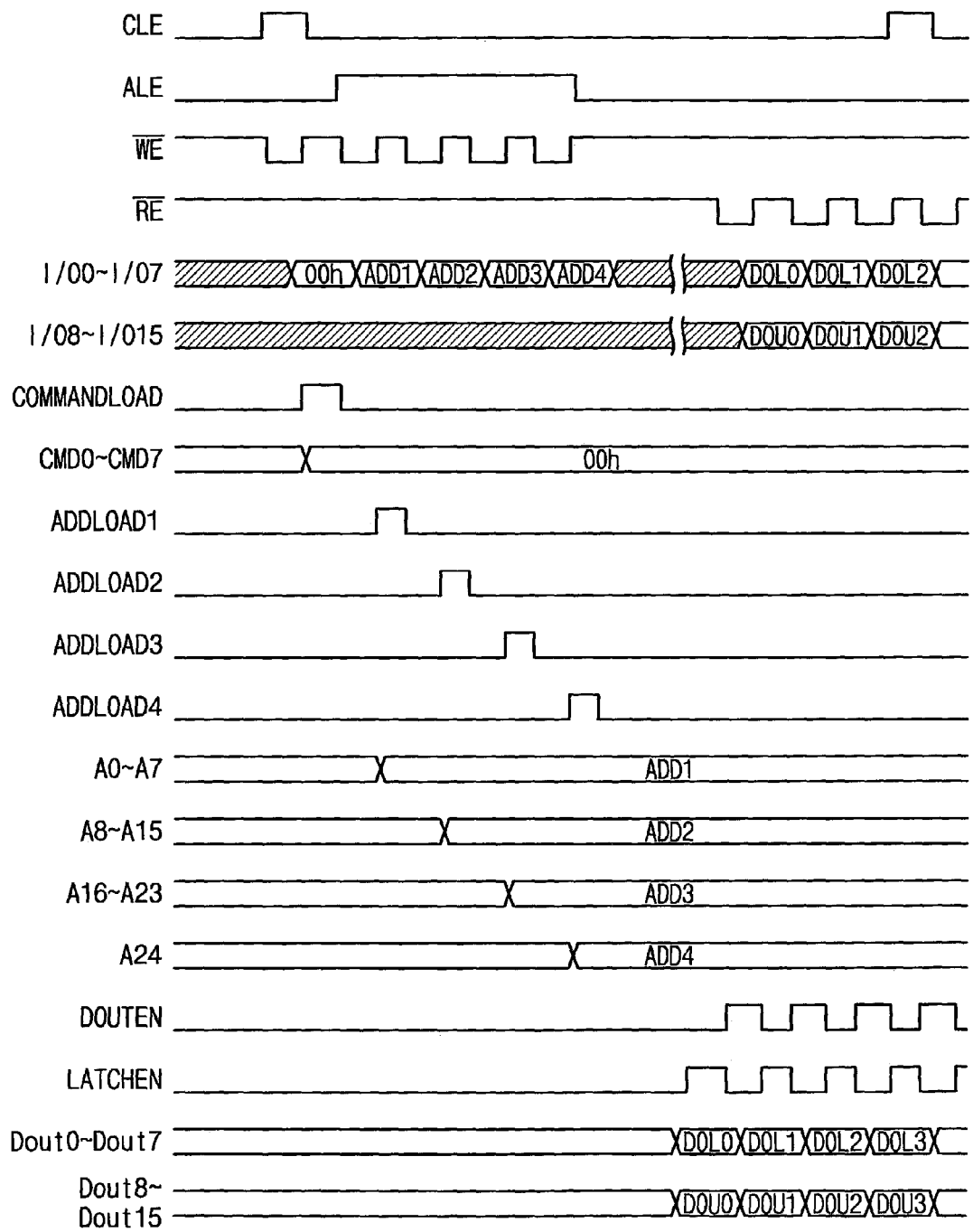
FIG. 8 is a timing diagram illustrating a read operation of a NAND flash memory device according to embodiments of the present invention.

FIG. 8 is a timing diagram illustrating a read operation of the NAND flash memory device according to embodiments of the present invention.

To begin with, 8-bit command data is provided from the outside to the memory device. Because the 8-bit command data is provided to 16-bit input/output pins I/00~I/015, valid 8-bit command data is provided to 8 least significant bit input/output pins I/00~I/07. Data loaded on 8 most significant bit input/output pins I/08~I/015 is invalid. The 8-bit command data (00h: a read operation command) loaded on the least significant bit input/output pins I/00~I/07 is latched in the first input buffer block 160 (FIG. 2A) according to a low-to-high transition of the signal WE. As the 8-bit command CMD0~CMD7, an output of the first input buffer block 160 is transferred to the command register block 180 (FIG. 4) via the first internal bus IN0~IN7, when the command load signal COMMANDLOAD transitions from a low level to a high level.

Next, when the signal CLE is low and the signal ALE is high, the 25-bit address is latched in the address register block 180 in synchronization with a high-to-low transition of the signal /WE. That is, when the address load signal ADDLOAD1 is activated, the 8-bit data loaded on the input/output pins I/00~I/07 is latched in the D flip-flops DFF of the first group of the address register block 150. When the address load signal ADDLOAD2 is activated, the 8-bit data loaded on the input/output pins I/00~I/07 is latched in the D flip-flops DFF of the second group of the address register block 150 (FIG. 3). When the address load signal ADDLOAD3 is activated, the 8-bit data loaded on the input/output pins I/00~I/07 is latched in the D flip-flops DFF of the third group of the address register block 150. When the address load signal ADDLOAD4 is activated, the 1-bit data loaded on the input/output pin I/00 is latched in the D flip-flop DFF of the fourth group of the address register block 150. The 25-bit address is latched in the address register block 150 through the foregoing steps. Consequently, address and command data are respectively latched in the corresponding registers 150 and 180 by a ×8 unit.

Thereafter, page data is latched in the sense and latch block 130 according to a well-known sensing method. Next, the data latched in the sense and latch block 130 will be outputted to the input/output pins I/00~I/015 by a ×16 unit. More specifically, first, 16-bit data is loaded on the data bus Dout0~Dout15 via the column decoder and switch block 140. The 16-bit data on the data bus is latched in the data output buffer block 210 at a low-to-high transition of the control signal LATCHEN. As illustrated in FIG. 8, the latched 16-bit data DOL0 and DOL0 are outputted to outside the memory device via the input/output pins I/00~I/015 at a low-to-high transition of the control signal DOUTEN (or at a high-to-low transition of the signal /RE). The data load operation will be performed repeatedly until all data to be programmed is loaded.

As explained so far, in the case of the NAND flash memory device according to embodiments of the present invention, a command and an address are interfaced by a ×8 unit while data is interfaced by a ×16 unit.

In accordance with one aspect of the present invention, there is provided a NAND flash memory device that comprises a memory cell array for storing data information. The memory device further includes M input/output pins for inputting and outputting M-bit data (M is any natural number). A control logic generates a plurality of address load signals, a command load signal, and a data load signal in response to external control signals. A first input buffer circuit receives N least significant bits (N is any natural number) of the M-bit data received via the input/output pins, and a second input buffer circuit receives N most significant bits received via the input/output pins. An address register receives as an address an output of the first input buffer circuit in response to the address load signals, which are serially activated. A command register receives as a command an output of the first address buffer circuit in response to the command load signal. A data input register simultaneously receives outputs of the first and second input buffer circuits in response to the data load signal, as data to be programmed. A row decoder and switch circuit selects a row of the memory cell array in response to row select information of an output of the address register, and a column decoder and switch circuit selects columns of the memory cell array in response to column select information of an output of the address register. A first data bus transfers M-bit data outputted from the data input register. A sense and latch circuit senses data from memory cells of the selected row at a read operation, and latches M-bit data on the first data bus via the column decoder and switch circuit at a program operation. A second data bus transfers M-bit data outputted from the sense and latch circuit via the column decoder and switch circuit, and a data output buffer circuit outputs M-bit data transferred via the second data bus to the M input/output pins. Here, at each of modes of operation where a command, an address, and data are serially received, the data is inputted and outputted through all of the M input/output pins while each of the command and the address is inputted through N least significant bit input/output pins. When each of the command and the address is inputted, signals on N most significant bit input/output pins are invalid.

In accordance with another aspect of the present invention, there is provided a NAND flash memory device that comprises a memory cell array for storing data information. The memory device further includes 16 input/output pins for inputting and outputting 16-bit data. A control logic generates a plurality of address load signals, a command load signal, and a data load signal in response to external control signals. A first input buffer circuit receives 8 least significant bits of the 16-bit data received via the input/output pins. A second input buffer circuit receives 8 most significant bits of 16-bit data received via the input/output pins. An address register is operated responsive to the address load signals, and receives as an address an output of the first input buffer circuit via a first internal bus. A command register is operated responsive to the command load signal, and receives as a command an output of the first address buffer circuit via the first internal bus. A data input register is operated responsive to the data load signal, and simultaneously receives an output of the first input buffer circuit via the first internal bus and an output of the second input buffer circuit via a second internal bus, as data to be programmed. A row decoder and switch circuit selects a row of the memory cell array in response to row select information of an output of the address register. A column decoder and switch circuit selects columns of the memory cell array in response to column select information of an output of the address register. A third internal bus transfers 16-bit data outputted from the data input register. A sense and latch circuit senses data from memory cells of the selected row at a read operation, and latches 16-bit data on the third internal bus via the column decoder and switch circuit at a program operation. A fourth internal bus transfers the 16-bit data outputted from the sense and latch circuit via the column decoder and switch circuit. A data output buffer circuit outputs the 16-bit data transferred via the fourth internal bus to the 16 input/output pins. Here, the first and second internal buses have the same bus width.

While the present invention has been described in connection with description of the preferred embodiment and drawings thereof, it is capable of various changes and modifications without departing from the spirit and scope of the invention.

What is claimed is:

1. A NANID flash memory device including a memory cell array for storing data information, the device comprising:
    M input/output pins for inputting and outputting M-bit data (M is any natural number);
    a control logic for receiving external control signals to generate a plurality of address load signals, a command load signal, and a data load signal;
    a first input buffer circuit for receiving N least significant bits (N is any natural number) of the M-bit data received via the input/output pins, wherein M is larger than N;
    a second input buffer circuit for receiving N most significant bit signals of the M-bit data received via the input/output pins;
    an address register for receiving as an address an output of the first input buffer circuit in response to the address load signals, wherein the address load signals are activated serially;
    a command register for receiving as a command the output of the first address buffer circuit in response to the command load signal;
    a data input register for simultaneously receiving outputs of the first and second input buffer circuits in response to the data load signal, as data to be programmed;
    a row decoder and switch circuit for selecting a row of the memory cell array in response to row select information of an output of the address register;
    a column decoder and switch circuit for selecting columns of the memory cell array in response to column select information of the output of the address register;
    a first data bus for transferring M-bit data outputted from the data input register;
    a sense and latch circuit for sensing data from memory cells of the selected row at a read operation and for latching the M-bit data on the first data bus via the column decoder and switch circuit at a program operation;
    a second data bus for transferring M-bit data outputted from the sense and latch circuit via the column decoder and switch circuit; and
    a data output buffer circuit for outputting the M-bit data transferred via the second data bus to the M input/output pins,
    wherein, at each mode of operation where a command, an address and data are received serially, the data is inputted and outputted through all of the M input/output pins while each of the command and the address is inputted through N least significant bit input/output pins, and
    wherein, when each of the command and the address is inputted, signals on N most significant bit input/output pins are invalid.

2. The NAND flash memory device as claimed in claim 1, wherein M is 16 and N is 8.

3. A NAND flash memory device comprising a memory cell array for storing data information, the device further comprising:
    16 input/output pins for inputting and outputting 16-bit data;
    a control logic for receiving external control signals to generate a plurality of address load signals, a command load signal, and a data load signal;
    a first input buffer circuit for receiving 8 least significant bit signals of the 16-bit data received via the 16 input/output pins;
    a second input buffer circuit for receiving 8 most significant bit signals of the 16-bit data received via the 16 input/output pins;
    an address register operated responsive to the address load signals, for receiving as an address an output of the first input buffer circuit through a first internal bus, wherein the address load signals are activated serially;
    a command register operated responsive to the command load signal, for receiving as a command the output of the first address buffer circuit through the first internal bus;
    a data input register operated responsive to the data load signal, for simultaneously receiving an output of the first input buffer circuit through the first internal bus and an output of the second input buffer circuit through a second internal bus, as data to be programmed;
    a row decoder and switch circuit for selecting a row of the memory cell array in response to row select information of an output of the address register;
    a column decoder and switch circuit for selecting columns of the memory cell array in response to column select information of the output of the address register;
    a third internal bus for transferring 16-bit data outputted from the data input register;
    a sense and latch circuit for sensing data from memory cells of the selected row at a read operation and for latching the 16-bit data on the first data bus via the column decoder and switch circuit at a program operation;
    a fourth internal bus for transferring 16-bit data outputted from the sense and latch circuit via the column decoder and switch circuit; and
    a data output buffer circuit for outputting the 16-bit data transferred via the second data bus to the 16 input/output pins,
    wherein, at each mode of operation where a command, an address and data are received serially, the data is inputted and outputted through all of the 16 input/output pins while each of the command and the address is inputted through 8 least significant bit input/output pins, and
    wherein, when each of the command and the address is inputted, signals on 8 most significant bit input/output pins are invalid.

4. The NAND flash memory device as claimed in claim 3, wherein the first and second internal buses have the same bus width.

5. A NAND flash memory device, comprising:
    a memory array for storing information;
    a pre-determined number of input/output pins for inputting and outputting data;

a control logic circuit for receiving external control signals to generate a plurality of address load signals, a command load signal, and a data load signal;

a first input buffer coupled to a first one-half the predetermined number of input/output pins, the first input buffer coupled to an address register, a command register, and a data input register; and a second input buffer coupled to a second one-half the predetermined number of input/output pins, the second input buffer coupled to the data input register, wherein, at each mode of operation where a command, an address and data are received serially, the data is inputted and outputted through all of the pre-determined number of input/output pins while each of the command and the address is inputted through only the first one-half the predetermined number of input pins, and wherein, when each of the command and the address is inputted, signals on second one-half the predetermined number of input pins are invalid.

6. The memory device of claim 5, further comprising a data output register coupled to the pre-determined number of input/output pins.

7. The memory device of claim 6, further comprising a first data bus having a bit-width equal to the predetermined number of input/output pins, the first data bus coupled to the memory cell array and to the data input register.

8. The memory device of claim 7, further comprising a second data bus having a bit-width equal to the bus-width of the first data bus, the second data bus coupled to the memory cell array and to the data output register.

9. The memory device of claim 5 wherein the predetermined number of input/output pins is 16.

10. A method of operating a non-volatile memory device having a pre-determined number of input/output pins, the method comprising:

accepting a command on a first-half of the predetermined number of input/output pins;

storing the command in a command register;

accepting an address on the first-half of the predetermined number of input/output pins;

storing the address in an address register; and accepting data on all of the pre-determined number of input/output pins, wherein, when either a command or an address are accepted by the memory device, data on a second-half of the predetermined number of input/output pins is invalid.

11. A method of operating a non-volatile memory device having a pre-determined number of input/output pins, the method comprising:

accepting a command on a first-half of the predetermined number of input/output pins;

storing the command in a command register:

accepting an address on the first-half of the predetermined number of input/output pins;

storing the address in an address register: and accepting data on all of the pre-determined number of input/output pins, wherein accepting a command on a first-half of the predetermined number of input/output pins comprises storing the command in a first input buffer.

12. The method of claim 11 wherein accepting an address on the first-half of the predetermined number of input/output pins comprises storing first input buffer.

13. The method of claim 11 wherein accepting data on all of the pre-determined number of input/output pins comprises storing a first portion of the data in the first input buffer, and storing a second portion of the data in a second input buff.

* * * * *

UNITED STATES PATENT AND TRADEMARK OFFICE
CERTIFICATE OF CORRECTION

| | |
|---|---|
| PATENT NO. | : 6,965,964 B2 |
| APPLICATION NO. | : 10/340359 |
| DATED | : November 15, 2005 |
| INVENTOR(S) | : Lee et al. |

It is certified that error appears in the above-identified patent and that said Letters Patent is hereby corrected as shown below:

At column 9, line 17, please replace "NANID" with --NAND--
At column 12, line 17, please replace "register:" with --register;--
At column 12, line 21, please replace "register:" with --register;--
At column 12, line 29, please replace "storing first input buffer." with --storing the address in the first input buffer.--
At column 12, line 34, please replace "buff." with --buffer.--

Signed and Sealed this

Ninth Day of January, 2007

JON W. DUDAS
*Director of the United States Patent and Trademark Office*